(12) United States Patent
Madurawe et al.

(10) Patent No.: US 7,573,293 B2
(45) Date of Patent: Aug. 11, 2009

(54) PROGRAMMABLE LOGIC BASED LATCHES AND SHIFT REGISTERS

(75) Inventors: Raminda Madurawe, Sunnyvale, CA (US); Nij Dorairaj, Campbell, CA (US)

(73) Assignee: Tier Logic, Inc., Santa Clara, CA (US)

( * ) Notice: Subject to any disclaimer, the term of this patent is extended or adjusted under 35 U.S.C. 154(b) by 0 days.

(21) Appl. No.: 12/119,490

(22) Filed: May 12, 2008

(65) Prior Publication Data

US 2009/0167349 A1 Jul. 2, 2009

Related U.S. Application Data

(63) Continuation-in-part of application No. 11/964,084, filed on Dec. 26, 2007.

(51) Int. Cl.
*H03K 19/173* (2006.01)
(52) U.S. Cl. .......................................... 326/38; 326/41
(58) Field of Classification Search ............. 326/37–41, 326/46
See application file for complete search history.

(56) References Cited

U.S. PATENT DOCUMENTS

| | | | |
|---|---|---|---|
| 4,609,986 A | 9/1986 | Hartmann et al. |
| 4,706,216 A | 11/1987 | Carter |
| 4,761,768 A | 8/1988 | Turner et al. |
| 4,864,161 A | 9/1989 | Norman et al. |
| 4,870,302 A | 9/1989 | Freeman |
| 4,873,459 A | 10/1989 | El Gamal et al. |
| 5,164,612 A | 11/1992 | Kaplinsky |
| 5,191,241 A | 3/1993 | McCollum et al. |
| 5,216,636 A | 6/1993 | Runaldue |
| 5,343,406 A | 8/1994 | Freeman et al. |
| 5,347,519 A | 9/1994 | Cooke et al. |
| 5,488,316 A | 1/1996 | Freeman et al. |
| 5,563,526 A | 10/1996 | Hastings et al. |
| 5,581,501 A | 12/1996 | Sansbury et al. |
| 5,612,631 A | 3/1997 | Agrawal et al. |
| 5,625,221 A | 4/1997 | Kim et al. |
| 5,679,967 A | 10/1997 | Janai et al. |
| 5,684,744 A | 11/1997 | Orgill et al. |
| 5,701,233 A | 12/1997 | Carson et al. |
| 5,781,031 A | 7/1998 | Bertin |
| 5,793,115 A | 8/1998 | Zavracky et al. |
| 5,835,405 A | 11/1998 | Tsui et al. |
| 5,844,422 A | 12/1998 | Trimberger et al. |

(Continued)

OTHER PUBLICATIONS

Chen Dong et al., "3-D nFPGA: A reconfigurable architecture for 3-D CMOS/Nanomaterial Hybrid Digital Circuits", IEEE Trans. Circuits and Systems, vol. 54, No. 11, Nov. 1, 2007 (pp. 2489-2501).

(Continued)

*Primary Examiner*—Don P Le
(74) *Attorney, Agent, or Firm*—Tran & Associates

(57) ABSTRACT

A latch is described, comprising: a first programmable logic element (LE); and a second programmable logic element (LE); and an output of the first LE adapted to directly couple to a first input of the second LE; and an output of the second LE coupled to a first input of the first LE; and a first common input coupled to a second input of the first and second LE; and a second common input coupled to a third input of the first and second LE.

20 Claims, 10 Drawing Sheets

U.S. PATENT DOCUMENTS

| | | | |
|---|---|---|---|
| 5,880,598 A | 3/1999 | Duong | |
| 5,943,574 A | 8/1999 | Tehrani et al. | |
| 5,949,710 A | 9/1999 | Pass et al. | |
| 5,949,719 A | 9/1999 | Clinton et al. | |
| 6,005,806 A | 12/1999 | Madurawe et al. | |
| 6,018,476 A | 1/2000 | Madurawe et al. | |
| 6,097,211 A | 8/2000 | Couts-Martin et al. | |
| 6,134,171 A | 10/2000 | Yamagata et al. | |
| 6,134,173 A | 10/2000 | Cliff et al. | |
| 6,191,614 B1 | 2/2001 | Schultz et al. | |
| 6,242,767 B1 | 6/2001 | How et al. | |
| 6,259,271 B1 | 7/2001 | Couts-Martin et al. | |
| 6,262,596 B1 | 7/2001 | Schultz et al. | |
| 6,275,064 B1 | 8/2001 | Agrawal et al. | |
| 6,275,065 B1 | 8/2001 | Mendel | |
| 6,331,784 B1 | 12/2001 | Mason et al. | |
| 6,331,789 B2 | 12/2001 | Or-Bach | |
| 6,337,579 B1 | 1/2002 | Mochida | |
| 6,340,830 B1 | 1/2002 | Takemura | |
| 6,353,562 B2 | 3/2002 | Bohm et al. | |
| 6,420,925 B1 | 7/2002 | Fifield et al. | |
| 6,426,649 B1 | 7/2002 | Fu et al. | |
| 6,448,808 B2 | 9/2002 | Young et al. | |
| 6,480,027 B1 | 11/2002 | Ngai et al. | |
| 6,496,887 B1 | 12/2002 | Plants | |
| 6,504,742 B1 | 1/2003 | Tran et al. | |
| 6,515,511 B2 | 2/2003 | Sugibayashi et al. | |
| 6,525,953 B1 | 2/2003 | Johnson | |
| 6,551,857 B2 | 4/2003 | Leedy | |
| 6,582,980 B2 | 6/2003 | Feldman et al. | |
| 6,613,611 B1 | 9/2003 | How et al. | |
| 6,614,259 B2 | 9/2003 | Couts-Martin et al. | |
| 6,627,985 B2 | 9/2003 | Huppenthal et al. | |
| 6,737,675 B2 | 5/2004 | Patel et al. | |
| 6,738,962 B1 | 5/2004 | Flaherty et al. | |
| 6,798,240 B1 | 9/2004 | Pedersen | |
| 6,812,731 B1 | 11/2004 | Trimberger | |
| 6,911,730 B1 | 6/2005 | New | |
| 6,946,330 B2 | 9/2005 | Yamazaki et al. | |
| 6,954,084 B2 | 10/2005 | Islam | |
| 6,992,503 B2 | 1/2006 | Madurawe | |
| 6,998,722 B2 | 2/2006 | Madurawe | |
| 7,019,557 B2 | 3/2006 | Madurawe | |
| 7,030,651 B2 | 4/2006 | Madurawe | |
| 7,064,018 B2 | 6/2006 | Madurawe | |
| 7,064,579 B2 | 6/2006 | Madurawe | |
| 7,084,666 B2 | 8/2006 | Madurawe | |
| 7,112,994 B2 | 9/2006 | Madurawe | |
| 7,176,713 B2 | 2/2007 | Madurawe | |
| 7,253,659 B2 | 8/2007 | Madurawe | |
| 7,268,580 B2 | 9/2007 | Madurawe | |
| 7,385,416 B1 * | 6/2008 | Chirania et al. | 326/38 |
| 7,482,835 B1 * | 1/2009 | Sun et al. | 326/41 |
| 2001/0003428 A1 | 6/2001 | Or-Bach | |
| 2001/0019155 A1 | 9/2001 | Warashina et al. | |
| 2001/0028059 A1 | 10/2001 | Emma et al. | |
| 2001/0047509 A1 | 11/2001 | Mason et al. | |
| 2002/0177260 A1 | 11/2002 | Matsumoto | |
| 2002/0186044 A1 | 12/2002 | Agrawal et al. | |
| 2003/0001615 A1 | 1/2003 | Sueyoshi et al. | |
| 2003/0023762 A1 | 1/2003 | Dhir et al. | |
| 2003/0085733 A1 | 5/2003 | Pugh et al. | |
| 2003/0227056 A1 | 12/2003 | Wang et al. | |
| 2004/0178819 A1 | 9/2004 | New | |
| 2004/0251930 A1 * | 12/2004 | Ngai et al. | 326/41 |
| 2005/0023656 A1 | 2/2005 | Leedy | |
| 2006/0195729 A1 | 8/2006 | Huppenthal | |
| 2007/0035328 A1 * | 2/2007 | New et al. | 326/38 |

OTHER PUBLICATIONS

Ashok K. Sharma, "Programmable Logic Handbook—PLDs, CPLDs, & FPGAs", 1998, pp. 99-171, McGraw-Hill, USA.

Alexander, et al., "Three Dimensional Field-Programmable Gate Arrays", Proceedings of the 8$^{th}$ Annual IEEE International ASIC Conference and Exhibit, 1995, pp. 253-256.

* cited by examiner

PROGRAMMABLE LOGIC BASED LATCHES AND SHIFT REGISTERS

This application is a continuation in part of application of Ser. No. 11/964084 filed Dec. 26, 2007 and entitled "USING PROGRAMMABLE LATCH TO IMPLEMENT LOGIC", the content of which is incorporated by reference.

BACKGROUND

Field Programmable Gate Arrays (FPGAs) include programmable circuits. These programmable circuits are constructed with programmable look up tables (LUTs) and Registers (or Flip-Flops) to implement logic as shown in FIG. 1. LUTs provide the means to program a logic function of two or more inputs, and registers provide the means to store either input or output values for subsequent use. A K-LUT 104 can implement a K-input function. In addition to LUTs, NAND, MUX and many other programmable logic elements can also implement logic. A programmable interconnect matrix (101, 102, 103, 108, 109) provides the means of coupling inputs and outputs as required by the logic function implemented in programmable logic element 107. In the prior-art logic element of FIG. 1, the LUT logic 104 output is fed to the Flip-Flop (FF) 105. The user can decide to store LUT output in the FF for synchronous logic implementations, or by-pass the FF for asynchronous logic implementations. A basic logic element (BLE) 106 comprises a LUT circuit 104 and a Flip-Flop 105. One or more BLEs may be combined to form a complex logic block (CLB) 107. Inputs to LUT 104 are received via the routing wires 101, input MUX 102, and local MUX 103. Output of LUT 104 or the FF 106 is routed through programmable points 108 back to the routing wires 109.

A plurality of logic elements are combined by FPGA tools to generate larger logic functions. When larger logic functions are implemented, unused logic within BLEs add to inefficiency of Silicon utilization and extra cost to end users. When larger logic functions are implemented, wires are used to connect the logical components. Wire congestion leads to sparse utilization of available logic, further adding to inefficiency in Silicon utilization. A logic function frequently required by the users is shift-registers within the FPGA fabric.

In a shift register, shown in FIG. 2A, data is presented as IN (shown from extreme left) and is shifted right each time when the clock goes high. At each clock the IN (the bit on the extreme left of register 201) appears on the first flip-flop 201 output (MSB). The bit on the extreme right (LSB) of register 204 is shifted out and lost.

For example, in the four bit shift register in FIG. 2A, with the first register 201 storing the MSB and the fourth register 204 storing the LSB, an exemplary shift pattern for an input string of "1010" provides "0101" at the output of the shift register as shown below.

| IN | OUT1 | OUT2 | OUT3 | OUT4 |
|----|------|------|------|------|
| 1  | 0    | 0    | 0    | 0    |
| 0  | 1    | 0    | 0    | 0    |
| 1  | 0    | 1    | 0    | 0    |
| 0  | 1    | 0    | 1    | 0    |
| x  | 0    | 1    | 0    | 1    |

In prior-art FPGAs, shift registers are implemented by connecting a plurality of FFs provided in the logic elements as shown in FIG. 2B. Data is fed as an input to a first LUT in a first logic element 211, and the first LUT output is latched to a first FF. The output of the first FF is routed through the global interconnect matrix as an input to a second LUT in a second logic element 212, and the second LUT output is latched to a second FF. A similar extension of connections allows users to construct larger chains of shift-registers. FPGA tools construct shift-register chains as described. In a realistic implementation of the shift-register, the stages are not necessarily placed adjacent to each other; but rather placed in random locations and routed by global interconnects. A more constrained placement is cumbersome to a user and rarely used. In such constructions, the entire LUT logic block simply acts as a wire to connect to the input of the FF, wasting valuable LUT logic resources that could have been used to implement logic. Wasted LUTs add to the Silicon cost when implementing shift-registers. An alternative scheme to save the extra cost is to provide dedicated shift-registers to the user at pre-determined positions. However, the user requirement and location is not apriori deterministic, and thus pre-positioned additions do not provide the most desirable user solution. In constrained or random placements of shift-registers, the output of the register in 211 is routed as an input to register in 212 by using global interconnects. These global wires tie up valuable horizontal & vertical wires—valuable resources that could be useful to connect other logical structures. Thus wire congestion is a significant challenge to automated place and route tools that must determine how these shift registers are placed and routed within the FPGA.

SUMMARY

A shift register is disclosed having a latch within a basic logic element (BLE); and a programmable interconnect coupled to the latch and adapted to transmit the latch output to another logic element in the BLE.

Implementations of the shift register may include one or more of the following. The BLE comprises one or more programmable logic elements. The BLE comprises one or more nonprogrammable logic elements. Some logic elements and interconnects may be configured by a configuration circuit. The logic elements include a LUT logic element, a MUX logic element or a second latch. The interconnect can include a buffer and/or a multiplexer. The interconnect connects a plurality of latches without going outside of the BLE. The interconnect connects a plurality of latches in the BLE without using any BLE output pins. The interconnect can couple a plurality of BLE's in a carry chain. One or more BLE's can form a configurable logic block (CLB). The interconnect can couple a plurality of CLB's in a carry chain. BLE's and CLB's are used to form an n-bit shift register. The latches can be positioned adjacent each other. The latches can also be vertically adjacent each other. Software tools may construct shift register utilizing latches within BLE's during automated design.

Such adjacency of the latches enable higher performance as the interconnect length is minimized. Hence, a high performance shift register can be implemented. Local programmable interconnect use minimize global congestion related to logic placement in CAD.

A latch is disclosed comprising cross coupled logic elements within programmable logic. A first and second logic elements receive a data input and a clock input; the output of first LE is coupled to the second LE and the output of second LE is coupled to first LE to form the cross-coupling. The first and second LE's are configured to generate a latch function.

Implementations of the latch may include one or more of the following. The BLE comprises one or more programmable logic elements. The logic elements include transistors, capacitors, resistors, diodes and other electronic elements. Logic elements and interconnects may be configured by a configuration circuit. Configuration circuits include random-access memory or read-only memory elements. The logic elements include LUT logic, MUX logic, ALU, P-term logic, NAND/NOR logic or other latches. Coupling uses interconnect. The interconnect can include a buffer and/or a multiplexer. Interconnect is used to form a latch. The interconnect connects a plurality of latches to form a shift register. One or more interconnects is local to BLE's without going outside of the BLE. A portion of the interconnect connects a plurality of latches in the BLE without using any BLE output pins. The interconnect can couple a plurality of BLE's in a carry chain. One or more BLE's can form a configurable logic block (CLB). The interconnect can couple a plurality of CLB's in a carry chain. BLE's and CLB's are used to form an n-bit shift register. A LUT based latch is termed a LUT latch. The LUT latches can be positioned adjacent each other. The LUT latches can also be vertically adjacent each other. LUT latches are adjacent to regular latches. LUT latches are combined to form shift registers. LUT latches are combined with regular latches to form shift registers. LUT latches are combined with flip-flops to form shift registers. Software tools may construct shift register utilizing latches within BLE's during automated design. Software tools may position LUT latches and regular latches to achieve a high silicon utilization of logic blocks.

DESCRIPTION

Embodiments of the current invention enhance the density of shift-registers in a programmable logic fabric. A first aspect is to conFIGure a LUT logic element (or any other logic element) as a latch, or a register, by providing feed-back capability within LUT logic to minimize external/global interconnect usage. A second aspect is the ability to use LUT logic independently as latches, and further access Flip-Flops for additional usage. Another aspect of it is to support the distributed nature of logic such that the user may position latches and shift-registers at any location within the programmable fabric. A third aspect is to combine a plurality of LUT latches to construct pipe-line stages or shift-register stages, without affecting the use of available Flip-Flops in the fabric. A fourth aspect is to combine LUT latches with Flip-Flops to double available register density over prior-art. Thus LUTs and Flip-Flops can be wired as shift registers or pipe-lined stages. A fifth aspect is to provide taps (probe nodes) at any output stage within the shift-register for observe-ability. A sixth aspect is providing recognition for a soft-ware tool to efficiently implement shift registers in an FPGA fabric as LUT latches, or combined LUT latches and Flip-Flops. A seventh aspect is to provide a BLE wherein a latch output can couple back to a LUT to enter a carry-logic path of the BLE. An eighth aspect is to construct a BLE such that a latch output can use the LUT as a feed-thru to couple to the next latch to avoid use of global wires. One or more of these advantages allows the user to use software tools to implement denser logic in a programmable logic fabric to achieve significant utilization efficiency, realizing lower cost per function for cost, power, reliability and performance benefits.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
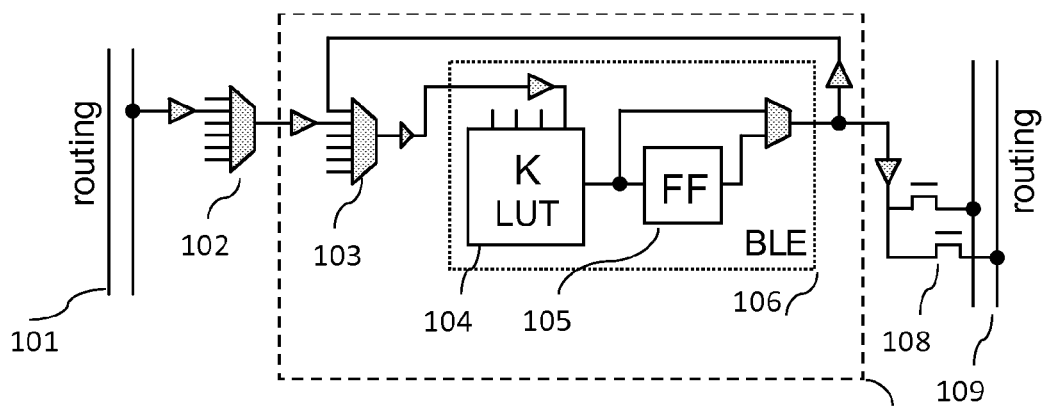
FIG. 1 shows a conventional FPGA logic element.
Figure 2A:
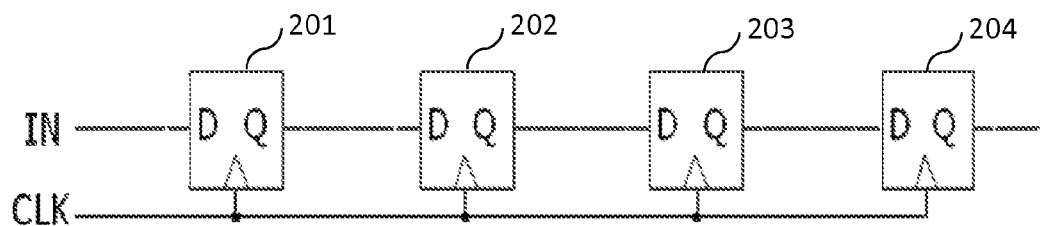
FIG. 2A shows a conventional 4-bit shift register.
Figure 2B:
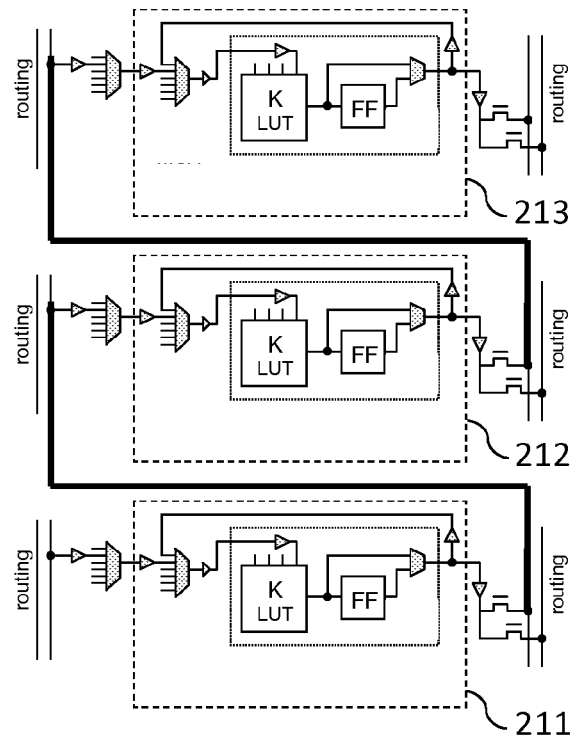
FIG. 2B shows a conventional shift register implementation using FPGA logic elements.
Figure 3:
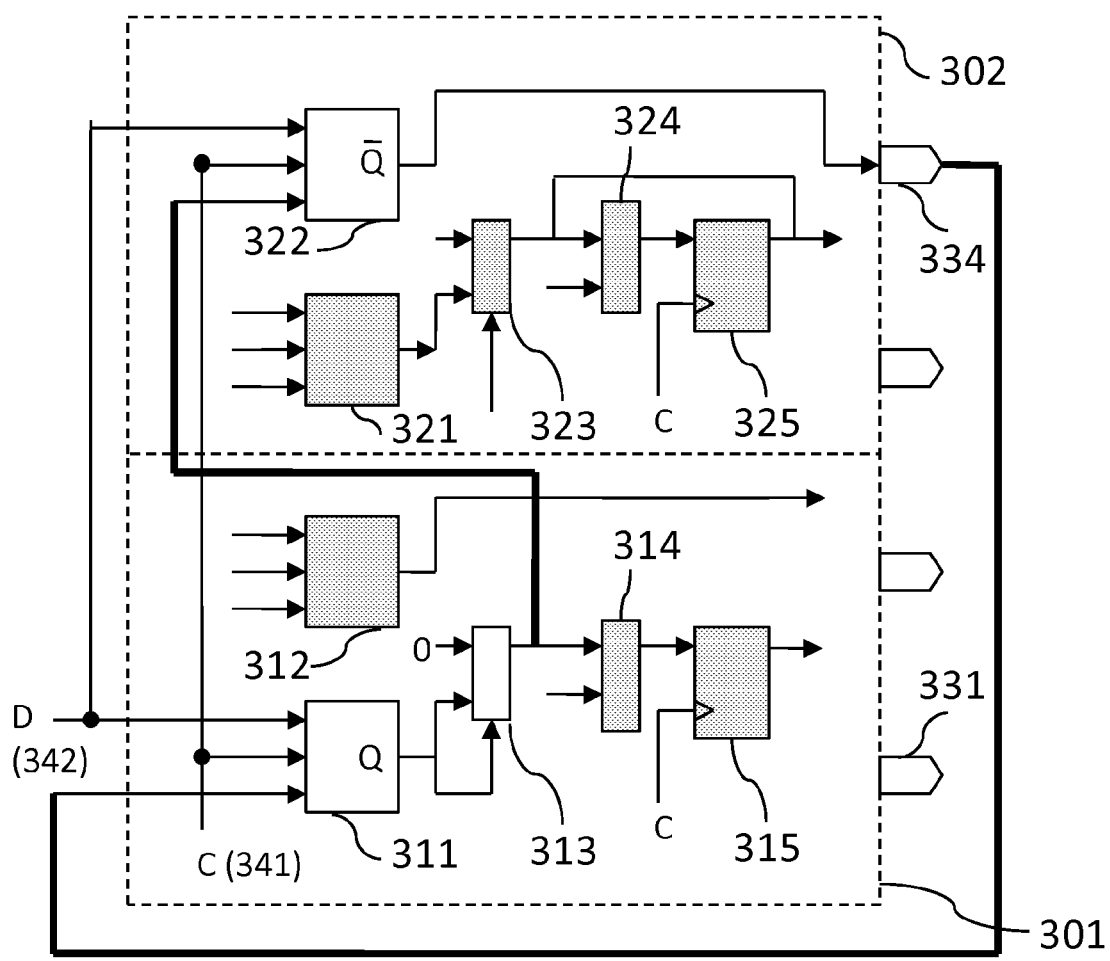
FIG. 3 shows an exemplary register formed by cross-coupling LUTs in accordance with one aspect of the invention.

FIG. 3 shows exemplary logic elements (example LUTs) cross coupled to form a LE latch (or LUT latch) with minimal external global routings. It is recognized that MUX logic, or any other logic, may be used instead of LUT logic without deviating from the scope of the invention. In FIG. 3, two LUTs 311 and 322 are cross-coupled to form a latch. All dark logic blocks in the figure (LUT 312, MUX 314, Latch 315, LUT 321, MUX 323, Latch 325) are available to the user to implement additional logic. Thus logic density is enhanced. To facilitate latch cross-coupling, LUT 311 output is coupled to a programmable MUX 313, and the output of MUX 313 is coupled to an input of LUT 322. All coupling is programmable. Although not shown, output of LUT 312 can be coupled to MUX 313. MUX 313 is further capable of having logic values 0 as well as logic value 1 as MUX inputs. MUX 313 has a select input, which can be coupled to external inputs as well as LUT 311 or LUT 312 output. In a preferred construction, LUTs 311, 312 and MUX 313 combine to form a higher order 7-input LUT. In another preferred construction, LUTs 311, 312 and MUX 313 combine to form a higher order 6-input LUT wherein one of the inputs to LUT 311 and one of the inputs to LUT 312 is a common input. A first LUT 311 receives data (D) 342, clock 341 and second LUT 322 output (feed-back) as inputs. The second LUT 322 receives D 342, clock 341 and 1st LUT 311 output (feed-back) as inputs. The LUT 322 output is coupled to LUT 311 through pin 334 via routing matrix. In another embodiment, this may be done thru a local wire. LUT 311 output thru MUX 31 is coupled to LUT 322 via a local wire. In a preferred embodiment, this provides flexibility of enhancing LUT logic, as well as reduce the external interconnect burden to support logic blocks. Output of LUT 311 is fed to MUX 313 as a MUX input as well as the select input. MUX 313 further receives data value 0 as a MUX input. Thus MUX 313 simply acts to pass the logic output of 311. The two LUTs 311 & 322 are configured such that:

C=0, 1st LUT output=not(2nd LUT output), 2nd LUT output=not(1st LUT output)
C=1, 1st LUT output=D, 2nd LUT output=not(D)

When C=0, any change to D is transparent to the two LUT logic functions. When C=1, the state of D is set at the output of 1st LUT 311, and state of /D (or the logical invert of D) is set at the output of second LUT 322. The data state is now set in the LUT latch. When C=0, the feed-backs maintain the stored data states allowing input D to take in the next data state. Clearly, the data state D must be valid within a set-up and hold time durations relative to the clock transition from high to low. Other forms of logic states can be created with opposite clock polarity if needed (i.e. /C). In a preferred embodiment of the latch shown in FIG. 3, both LUT circuits 311 & 322 are 3-input LUT (3LUT) functions. 3LUT is the minimum LUT size to implement a feed-back latch requiring 3-inputs: D input, clock input and Q or /Q feedback input. A 4-LUT could be used to add Set/Reset feature easily into a LUT latch along the described principles herein. However, any 4LUT or 6LUT implementation of the 3-input LUT Latch is a wastage of available logic and silicon resources. In the added feature shown herein, when a first 3LUT output may couple as an input to a second 3LUT, one familiar in the art can construct many interconnect implementations including the use of a carry-logic signal as a coupling wire. Such LUT architectures avoid external routing resources and delays. In FIG. 3, the output of 1st LUT 312 can be taken out into a carry signal, and the carry is fed as an input to 2nd LUT 322. Such carry construction enhances logic capability of LUTs. In FIG-3, LUT logic is utilized to implement latches in addition to the latches 315 & 325 available in the FPGA fabric to enhance latch density.

In the programmable latch of FIG. 3, two LUT based logic elements are cross-coupled to form a latch. An output of a first logic element 311 is coupled to a first input of a second logic element 322; an output of the second logic element 322 is coupled to a first input of the first logic element 311; a data input 342 is coupled to a second input of said first (311) and second (322) logic elements; a clock input 341 is coupled to a third input of said first (311) and second (322) logic elements; wherein, during a first clock input state, each logic element output is set by the first input (latched data); and wherein, during a second clock input state, each logic element output is set by the second input 342 (new data).

Figure 4:
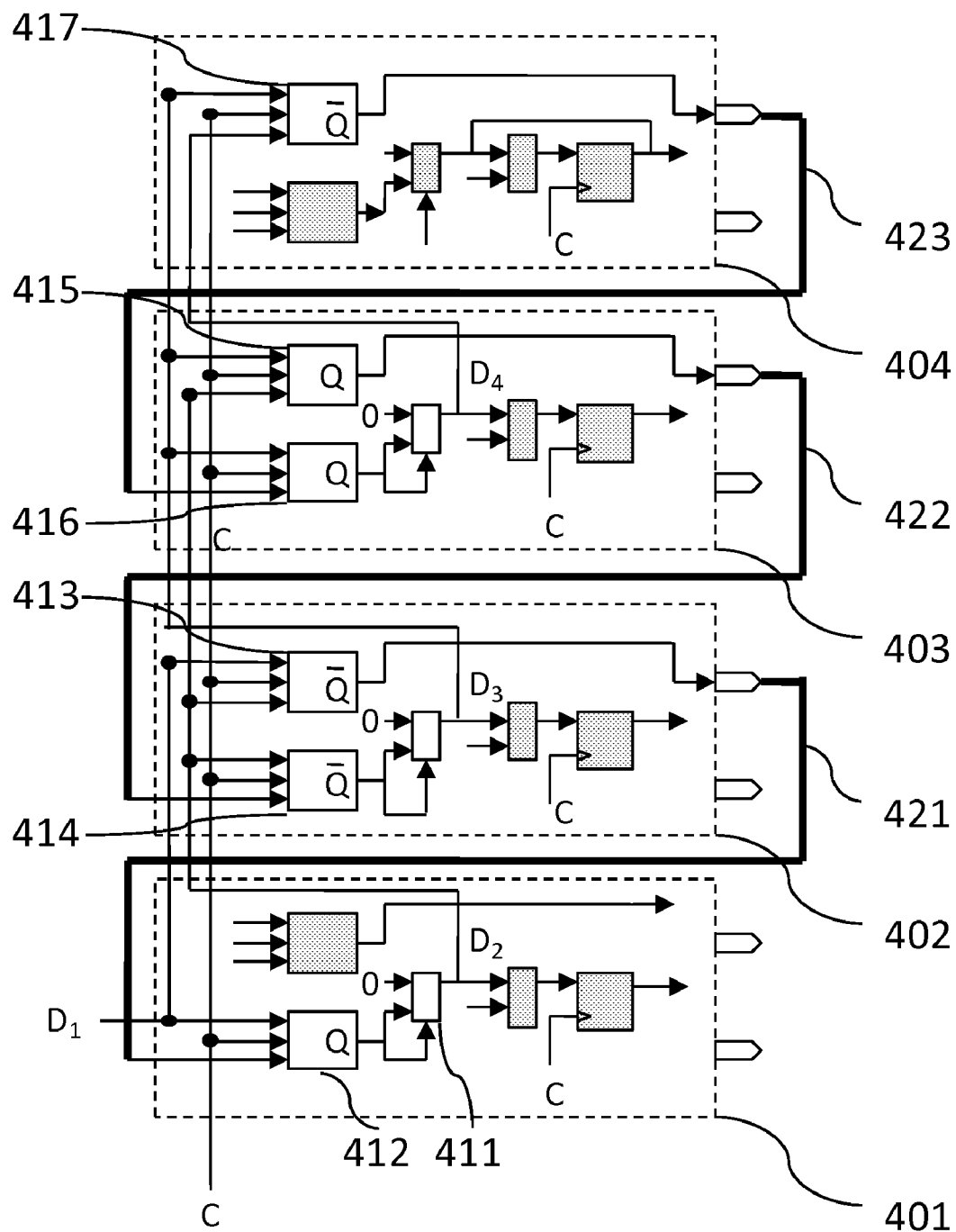
FIG. 4 shows an exemplary 4-stage shift register in accordance with one aspect of the invention.

In FIG. 4, a 3-stage shift register (SR) is constructed by combining a plurality of LUT Latch elements shown in FIG. 3. Four BLE's 401-404 are shown in FIG. 4 for illustrative purposes. Additional BLE's may be similarly combined to construct higher order shift registers. Each BLE is similar to BLE 301 shown in FIG. 3. A plurality of logic elements within shown BLE's are not used for the SR implementation and could be used for other logic placements. Thus the LUT elements of only three equivalent BLE's are utilized for a 3-stage SR. A clock input C is common to all logic elements 412, 413, 414, 415, 416 and 417 used for shift registers. The advantage of LUT logic is that clock polarity can be reversed within the LUT logic (by choosing the appropriate configuration data) without having to invert clock signals. Paired logic elements 412-413, 414-415, 416-417 implement latches as described in FIG-3. Feed-back lines 421, 422, 423 provide the necessary cross-coupling for respective latches. The odd latches, first latch 412-413 LE pair and third latch 416-417, work on the positive clock C polarity. The even latches, second latch 414-415, work on the negative phase of the clock C polarity (i.e. /C). A data $D_1$ input is provided to logic element 412 in BLE 401. When C=1, $D_1$ is written to first latch. The first latch 412-413 output $D_2$ is received at output of logic element 411. This $D_2$ output is provided as an input to second latch 414-415. When C=1, $D_2$ is not written to second latch. When /C=1, $D_2$ is written to second latch. The second latch 414-415 output $D_3$ is provided as an input to third latch 416-417. When /C=1, $D_3$ is not written to third latch. When C=1, $D_3$ is written to third latch, and the data appears at the $D_4$ output. Thus the clock polarity is used to prevent feed-thru of data values in the shift-register. One familiar in the art may construct other clocking schemes and logic conditions to ensure proper storage of latch data without deviating from the basic concept described herein.

Figure 5:
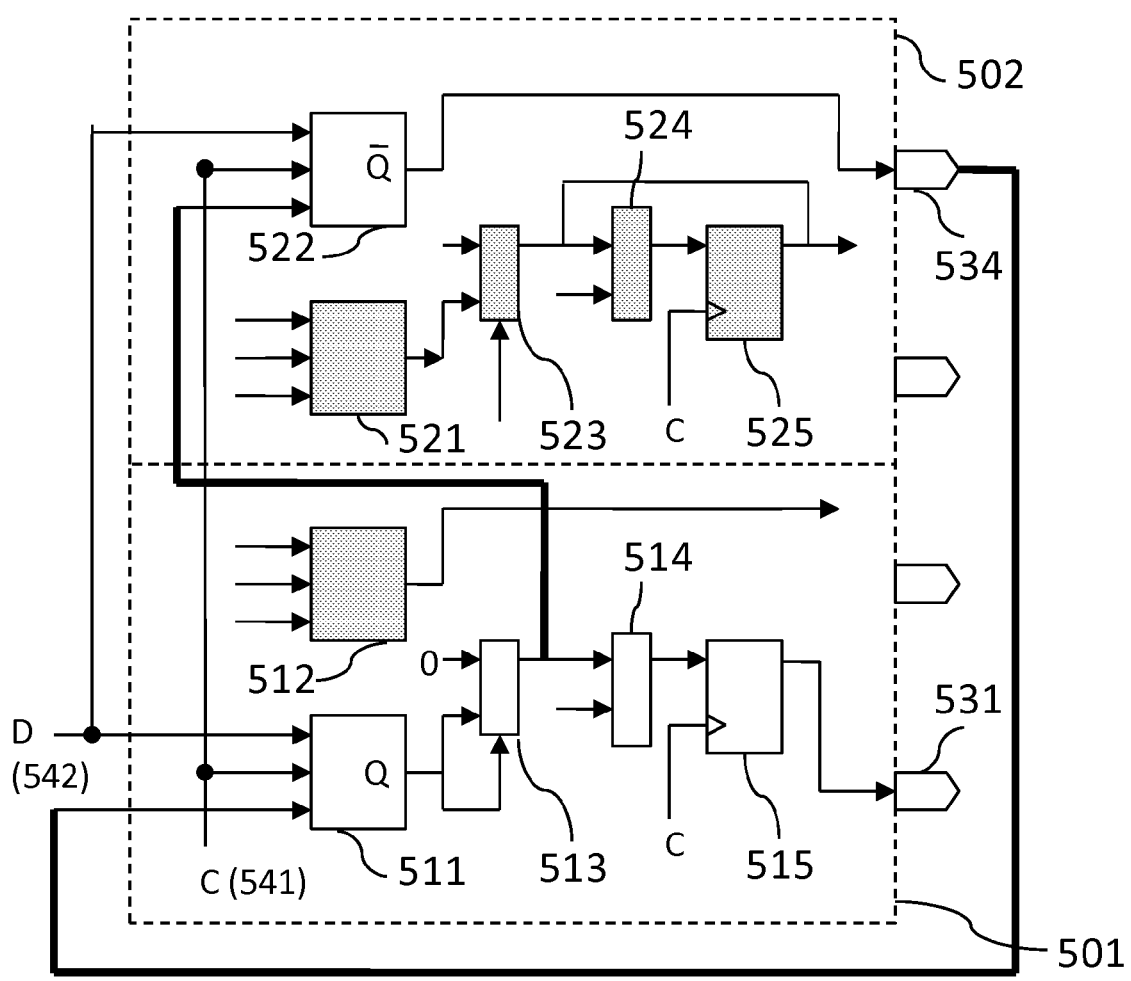
FIG. 5 shows an exemplary 2-stage shift register in accordance with another aspect of the invention.

FIG. 5 is an illustration of combining a LE latch (or LUT latch) with a flip-flop (or register) FF to generate a 2-bit shift register. The first latch is a LUT latch comprising LUT pair 511 & 512. Pin 534 is used as the cross-coupling between the two LUTs 511 and 512. The LUT latch receives a data D input 542. The output of first latch is provided as an input to FF 515. Both LUT latch and FF receive a clock C input 541. The LUT latch is as described in FIG. 3, and Flip-Flop 515 could be a regular FF as described in prior art. The LUT latch may be stored at C=1, or /C=1 based on LUT logic configuration. Then clock phase is appropriately adjusted to ensure FF receives true data with respect to clock phase to avoid feed-through conditions. In FIG. 5, logic elements 512, 521, 523, 524, 525, and BLE pins 532, 533 (between pins 531 and 534) are not utilized by the SR, and may be used to pack additional logic.

In FIG. 5, the latch 511/522 output is fed as an input to the FF 515, and the output of the FF is routed to pin 531 in the logic element global routing matrix. The FF 515 can be configured as a master-slave FF. It has the features:

C=0, input to FF is latched to master, Slave stage is decoupled from master stage
C=1, input to FF is decoupled from master, Slave stage latches data from master stage The system of FIG. 5 is a two stage SR with LUT logic forming a first stage, and the FF forming the second stage.

First, when C=0, the following is seen:
D is decoupled from both LUTs 511 & 512, the two LUTs maintain previously written data
FF Master is enabled—output of LUT latch is written into master stage
Slave is disabled—slave stage keeps previously written data When C=1, the following is seen:
D is written to LUT latch, the prior data is over-written
FF Master is disabled—output of new LUT latch is prevented from entering master stage
Slave is now enabled—prior master stage data is written to slave stage Thus the data has shifted one stage during the C=0 and C=1 cycle for the 2-stage shift register of FIG. 5.

In the two stage SR of FIG. 5, a first latch comprising cross-coupled LUT logic elements 511 and 522 is coupled to a second latch 515, the first latch receives a data input 542, and both latches receive a clock input 541. In the first latch, latch data is maintained during a first phase of the clock, and new data is stored during a second phase of the clock. In the second latch, latch data is maintained during the second phase of the clock, and new data is stored during the first phase of the clock. The second latch may be a master-slave flip flop.

Figure 6:
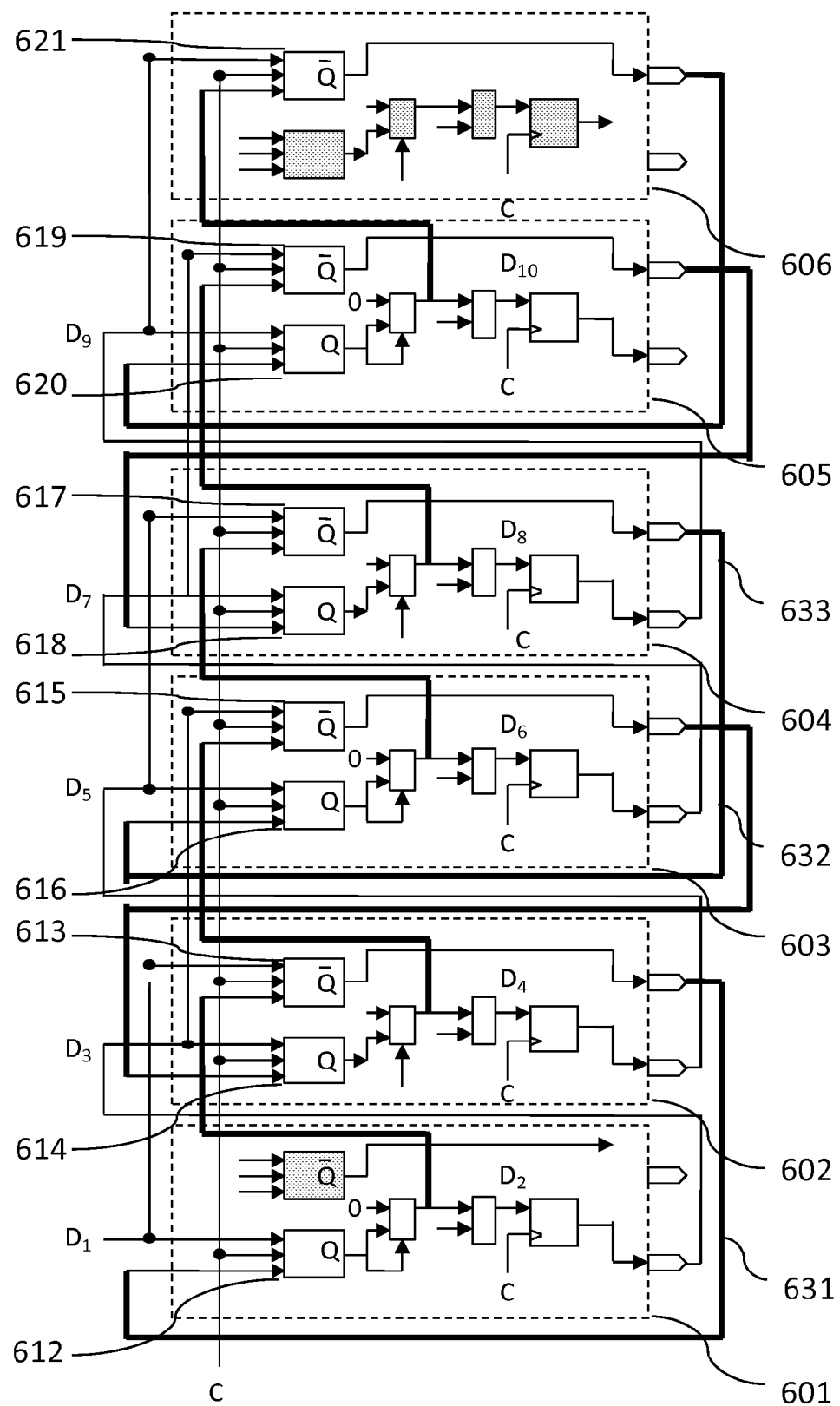
FIG. 6 shows an exemplary 10-stage shift register in accordance with one aspect of the invention.

FIG. 6 shows an expansion of the concept described in FIG. 5 to a 10-stage shift register. The bottom half of BLE 601 and the top half of BLE 606 are not utilized by the SR, and can be used for additional logic placements. Thus an equivalent of 5 basic logic blocks are utilized to implement the 10-stage SR. Five LUT latch pairs are 612-613, 614-615, 616-617, 618-619 and 620-621. First LUT latch pair 612-613 receives data $D_1$ input, and the latch output $D_2$ is fed to FF in BLE 601. FF output $D_3$ is fed to second LUT latch pair 614-615, and the latch output $D_4$ is fed to FF in BLE 602. All LUT latches and FF receive clock C. As previously stated, LUT logic can be configured to latch data either when C=1, or when /C=1. Thus feed-through conditions can be avoided in the SR. One familiar in the art may construct how data is shifted in the SR analogous to data shifting described with respect to FIG. 5. It is further understood that clock polarity can be reversed such that /C=0 and /C=1 may be used to complete a shift cycle in the SR.

Figure 7:
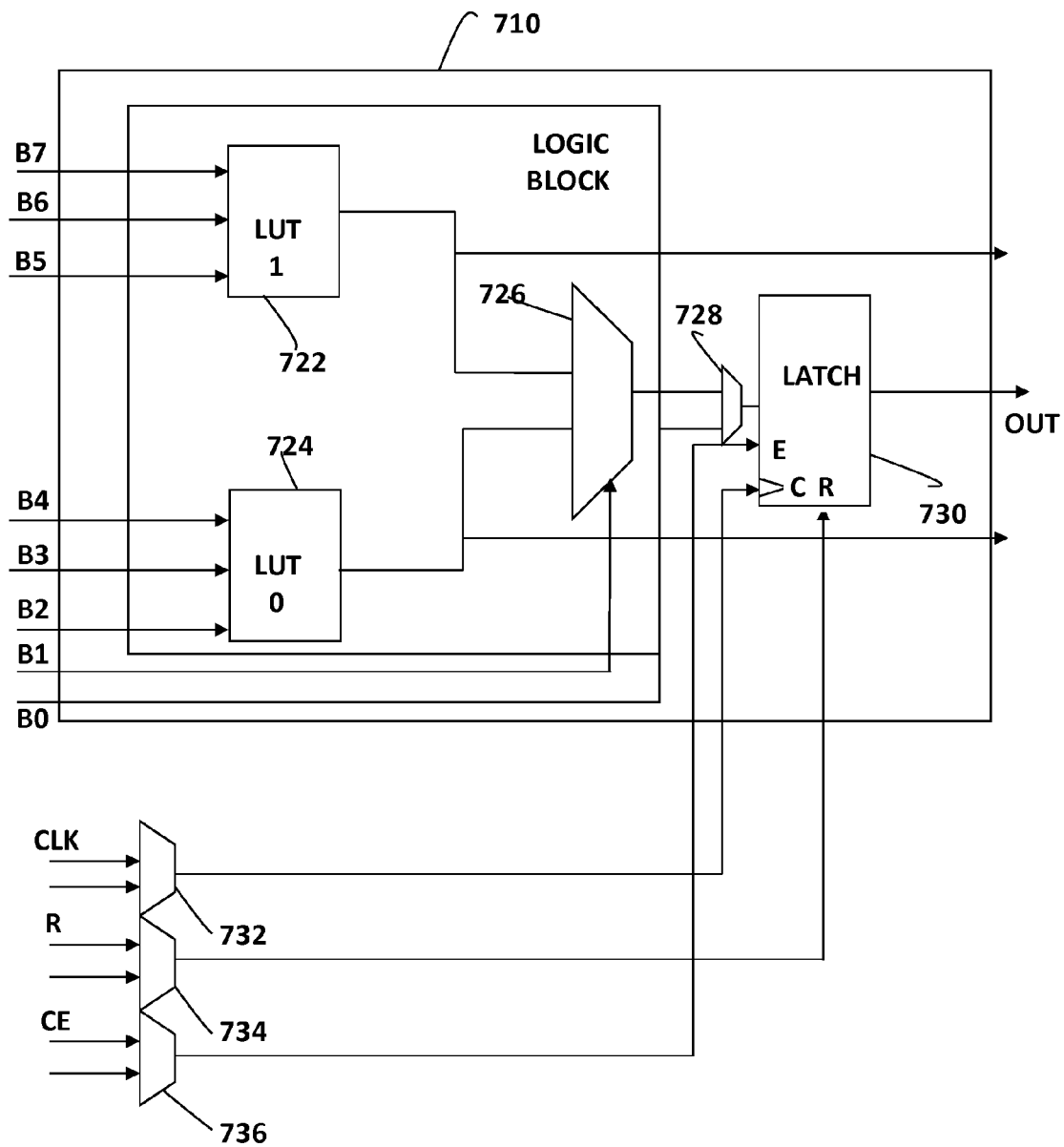
FIG. 7 shows an exemplary logic block in accordance with the invention.

FIG. 7 shows a more detailed view of one embodiment of an exemplary logic block that can be used as a shift register. In FIG. 7, the exemplary logic block 710 may be a basic logic element, or a portion of a basic logic element. It comprises a latch 730. A look up table (LUT) 724 receives inputs B2, B3 and B4, respectively. Similarly a, LUT 722 receives inputs B5, B6, B7. The outputs of the LUTs 522 and 524 are provided to a multiplexer (MUX) 726 which is controlled by input B1. Together, logic elements 722, 724 and 726 may be a higher order LUT logic block. One familiar in the art may easily construct MUX logic blocks to replace the LUT logic blocks shown for illustrative purposes in FIG. 7. The MUX 726 output can serve as a carry propagator to a logic block similar to 710 located adjacent to logic block 710. A carry-in signal is received as an input (not shown) to MUX 726. To implement a carry function, LUT 724 is configured to generate the OR function of two bits, and LUT 722 is configured to generate the SUM unction of the two bits, while the MUX 726 receives carry-in as an input to generate carry-out as an output. The output of MUX 726 is provided to another MUX 728 which receives BO at a second input. The output of the MUX 728 is provided to the input of a latch 730, which is described in more details in the incorporated by reference Ser. No. 11/964084 filed Dec. 26, 2007 and entitled "USING PROGRAMMABLE LATCH TO IMPLEMENT LOGIC".

Turning now to the control signals for the latch 730, a MUX 736 receives a global enable signal E and a local enable signal e and the output of the MUX 736 is provided to the enable control of the latch 730. Similarly, a MUX 732 receives a global clock signal C and a local clock signal c and the output of the MUX 732 drives the clock input of the latch 730. Additionally, a MUX 734 receives a global reset signal R and a local reset signal r and the output of the MUX 734 is provided to the reset control of the latch 730. The output of the latch 730 is a logic function which in this embodiment is an AND of the local signals e, c and r and the inputs B0-B7. The local signals may be generated by other logic blocks such as LUT 724.

Figure 8A:
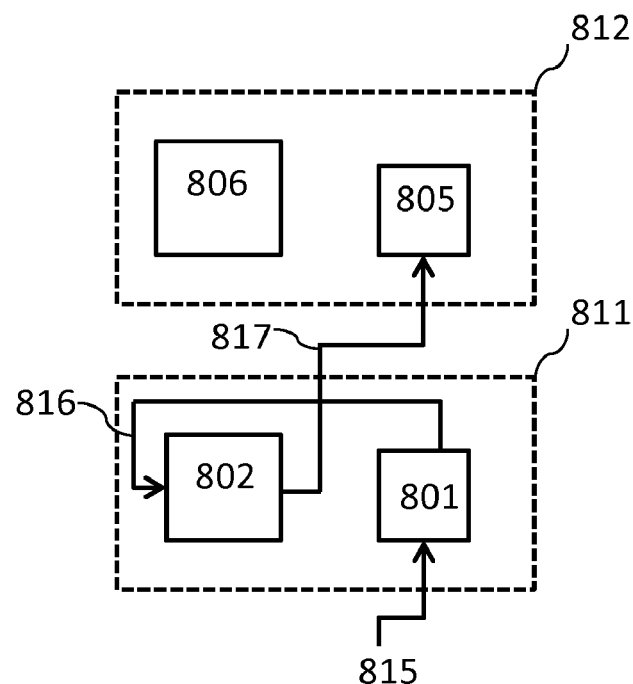
FIG. 8A shows an exemplary 2-stage shift register in accordance with one aspect of the invention.

FIG. 8A shows a first embodiment of a two stage shift register, comprising: a first latch 801 within a first logic block (LB) 811 having a data input 815, the first LB 801 further having a first logic element (LE) 802 comprising an input and an output; and a second latch 805 having a data input; and a first interconnect 816 to couple the first latch output to the first LE input; and a second interconnect 817 to couple the first LE output to the second latch data input. The interconnect 816 and 817 may be dedicated to avoid global wire congestion and fast data propagation in the SR construction.

Figure 8B:
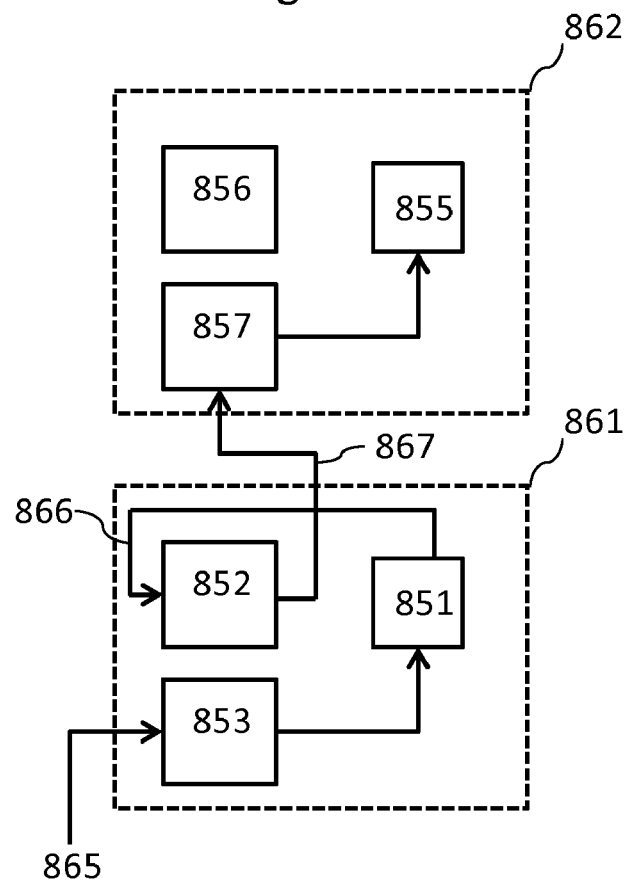
FIG. 8B shows an exemplary 2-stage shift register in accordance with one aspect of the invention.

FIG. 8B shows a second embodiment of a two stage shift register, comprising: a first latch 853 within a first logic block (LB) 861 having a data input 865, the first LB further having a first logic element (LE) 852 comprising an input and an output; and a second latch 855 having a data input; and a first interconnect 866 to couple the first latch output to the first LE input; and a second interconnect 867 to couple the first LE output to the second latch data input. In FIG. 8B, the first LB 861 further comprises a second LE 853 having an input and an output, wherein: the data signal 865 is coupled to the second LE input, and the second LE output is coupled to the first latch 851 data input. The second LB 862 further comprises a second LE 856 which allows the latch 855 output to feed-thru to a third logic block not shown in the figure. The interconnect 866 and 867 may be dedicated to avoid global wire congestion and fast data propagation in the SR construction.

Figure 9:
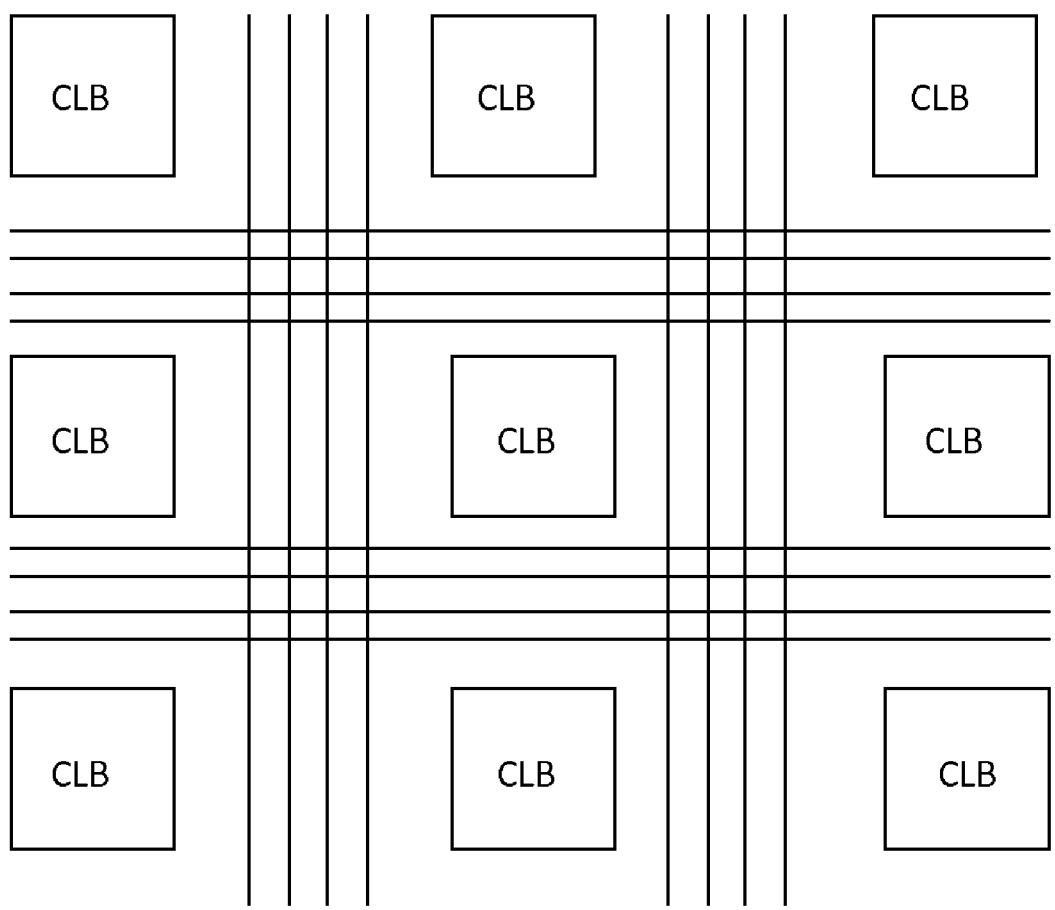
FIG. 9 shows an exemplary FPGA fabric comprising CLBs and interconnects in accordance with one aspect of the invention.

FIG. 9 shows an exemplary logic and interconnect matrix according to a first aspect of the invention. A plurality of complex logic blocks denoted CLB are repeated among horizontal and vertical global routing wires. Each CLB may comprise a plurality of basic logic elements such as FIG. 7. Logic within a CLB may be coupled to other CLB's via the global interconnect. The routing wires include control logic wires such as clock, set, reset controls used by flip-flops within the CLB. When a SR is implemented, a software tool identifies a network having serially connected array of latches either within a CLB or across a plurality of CLB's. In the network of FIG. 9, the input to the MSB is clocked by signal CLK and is propagated through the latches in the CLB's as net1, net2, and net3 in this example.

Figure 10:
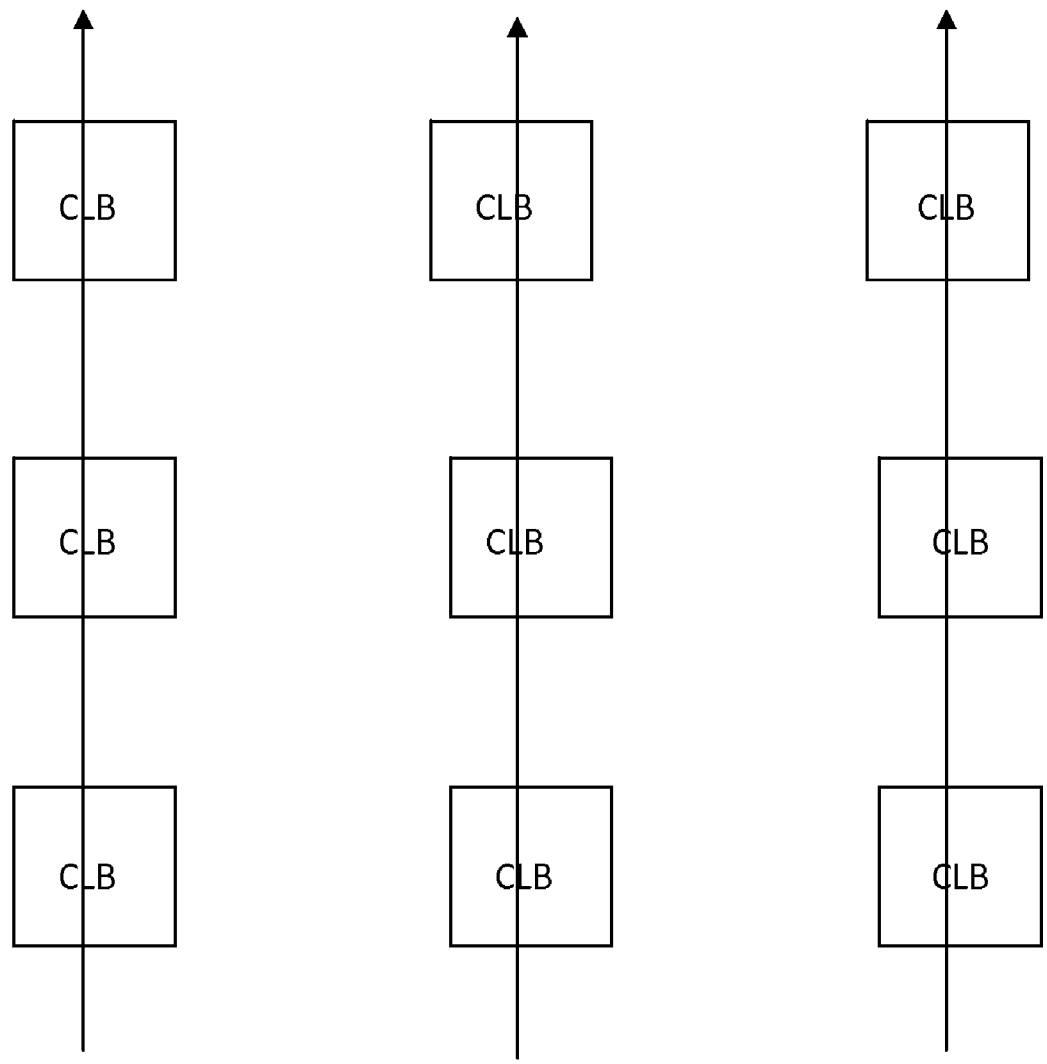
FIG. 10 shows carry-chains within an FPGA fabric in accordance with one aspect of the invention.

FIG. 10 shows exemplary local routing resources to interconnect the logic blocks of adjacent basic logic elements. These local interconnects may span across a plurality of CLB's to allow users to create long logic chains. Such a logic feature is provided by a carry-logic chain. The array of CLB's include global routing tracks on horizontal and vertical directions, and these global resources are used for connecting nets from one CLB to another. The global routing resources are generally slower than local routing resources within a CLB as they are segmented at a predetermined distance. In contrast, within the CLB, and across CLB's, the local routing resources are continuous. Furthermore local routes have less capacitance over global routes. Thus carry-logic computations are faster than generic logic computations requiring global routing resources. These routes can be used for arithmetic operation to propagate carry signals from one stage to the next and thus are referred to as "carry chain" resources.

Figure 11:
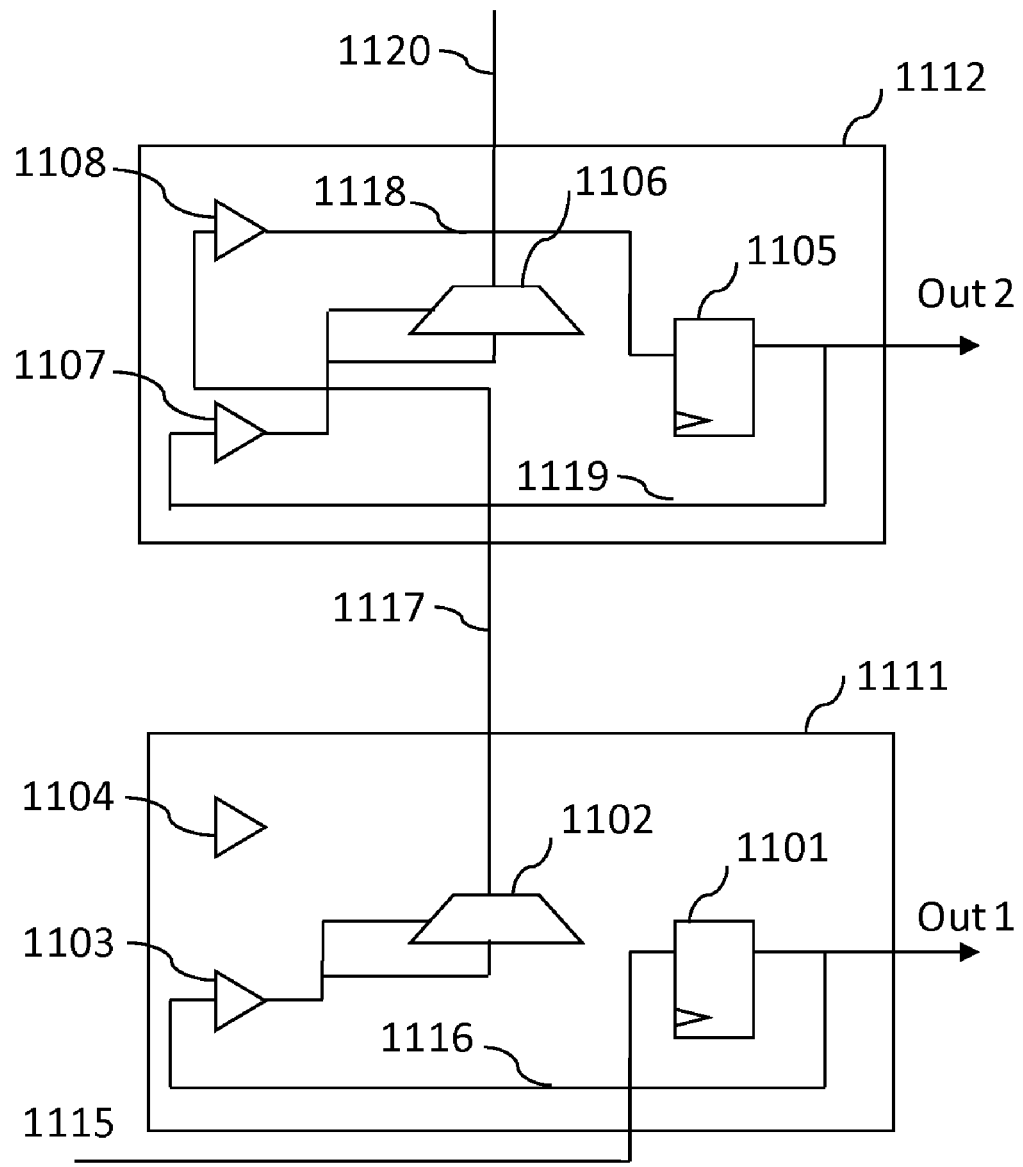
FIG. 11 shows a shift register implementation utilizing carry-chains in accordance with one aspect of the invention.

FIG. 11 shows a detailed embodiment of a carry-chain type dedicated routing arrangement to implement shift registers. Logic blocks 1111 and 1112 are cascaded to provide the local carry chain type dedicated routing for a shift register implementation. The logic block 1111 has a latch 1101 receiving a Shift_IN 1115 input signal. The output of the latch 1101 OUT1 is provided to a buffer 1103 via interconnect 1116, which drives the select input of a MUX 1102. The buffer 1103 may include a logic element such as a LUT that is not shown in the diagram. MUX 1102 may be a LUT logic element configured as a MUX. Logic element 1102 acts as a feed-thru for the input. A second buffer (with or without LUT logic elements) 1104 is unconnected for the first stage, and could be used for non related logic placement. The output of the MUX 1102 is provided to a buffer 1108 in the next logic block 1112. In the second logic block 1112, a latch 1105 receives the output from the buffer 1108 and generates OUT2. OUT2 is also provided to a buffer 1107 via interconnect 1119, which drives the selection input of the MUX 1116, whose output is provided to the next shift register stage in an adjacent logic block via interconnect 1120. Interconnects 1116, 1117, 1118, 1119 are all local to logic blocks 1111 and 1112, and do not require use of global wires present in FPGA fabric. Thus the SR implementation does not add to congestion of routing wires, facilitating easy SR logic placements within complex systems designs for software tools. Further more the shift time delays are reduced by the carry-type routing arrangement implemented within the logic blocks.

An exemplary Verilog code for an 8-bit shift register using dedicated interconnects is shown below:

```
'timescale 1 ps / 1 ps
module BLE_SHIFT (Q, C, CE, D);
  parameter STAGES = 8;
  output    Q;
  input     CE, C, D;
  wire   shift[STAGES-1:0];
  wire   dff_feed[STAGES-1:0];
  wire   dff_out[STAGES-1:0];
  wire   mux_feed[STAGES-1:0];
  // stage 0
  VDFFE ff0 ( .C(C), .D(D), .CE(CE), .Q(dff_out[0]) );
  VLUT1 mux_feed0 (.I0(dff_out[0]), .O(mux_feed[0]) );
  defparam mux_feed0.LUTVALS = 2'h2;
  VMUX_C shift0 ( .DI(1'b0), .CI(1'b1), .S(mux_feed[0]),
    .CO(shift[0]) );
  genvar i;
  generate
    for( i = 1; i < STAGES; i = i + 1 )
      begin: shiftgen
        VLUT1 shiftrcvi (.I0(shift[i-1]), .O(dff_feed[i]) );
        defparam shiftrcvi.LUTVALS = 2'h2;
        VDFFE ffi ( .C(C), .D(dff_feed[i]), .CE(CE), .Q(dff_out[i]) );
        VLUT1 mux_feedi (.I0(dff_out[i]), .O(mux_feed[i]) );
        defparam mux_feedi.LUTVALS = 2'h2;
        VMUX_C shifti ( .DI(1'b0), .CI(1'b1), .S(mux_feed[i]),
          .CO(shift[i]) );
      end
  endgenerate
  assign       Q = shift[STAGES-1];
endmodule
module shift_test( Q, C, D);
  output   Q;
  input    C, D;
  BLE_SHIFT inst1 ( .Q(Q), .CE(1'b1), .C(C), .D(D));
    endmodule // shift_test
```

The latch may be an SRAM cell, or include one or more SRAM cells. One or more transistors of the latch may comprise thin film transistors constructed in a semiconductor thin film layer located substantially above logic transistors. The TFT transistors are buried above the logic gates of an Integrated Circuit to consume no extra Silicon real estate, as discussed in commonly owned U.S. patent applications 20040207100 and 20060146596, the contents of which are incorporated by reference. One or more transistors of the latch may be constructed in Silicon substrate layer adjacent to logic gates of an Integrated Circuit. One or more programmable inputs or outputs of the latch may be configured by TFT transistors and TFT memory devices located substantially above or below latch transistors.

In certain embodiments, the latch implementing logic functions can work with antifuses. The antifuse is suitable for virtually any integrated circuit where a fuse or antifuse is desirable to store permanent data. For example, the antifuse can be used as part of a generic integrated memory address circuit to select redundant rows or columns within a ROM, EEROM, PROM, flash RAM, or DRAM. In many embodiments, the integrated circuit is part of a larger system, such as a computer system or more generally a computerized system including a microprocessor or digital signal processor coupled to the memory circuit. In addition to the antifuses, memory address circuit includes a set of address transistors, a set of redundant address transistors, and conventional laser fuses. Address transistors are conventionally used to address rows or columns in the memory array. Each row or column includes one or more memory cells. One or more of the above antifuses and one or more of laser fuses can be selectively programmed to replace one or more of memory rows or columns with redundant memory row or column. In some embodiments, one or more of the antifuses are programmed and one or more others remain unprogrammed, and in some embodiments all the antifuses are either programmed or unprogrammed.

The LUT can be circuits as disclosed in commonly owned U.S. patent applications 20070171105 and 20070035329, the contents of which are incorporated by reference. The LUT makes use of additional programmable elements inside the large LUT structure, enabling sub-division of LUTs. A complex design can be fitted as a single larger logic LUT or as many smaller logic LUT pieces: both maximizing the Silicon utilization. In the reference, a 2LUT divisible 4LUT macro-cell (shown in FIG. 16A) provides a 2× improvement in logic packing compared to hard-wired 4LUT logic elements. The increased memory content is justified by a 3-dimentional thin-film transistor module integration that allows all configuration circuits to be built vertically above logic circuits. These memory circuits contain TFT memory elements that control pass-gates constructed in substrate Silicon. The TFT layers are fabricated above a metal layer in a removable module, facilitating a novel method to remove completely from the process in preference to hard-wired replacements. Configuration circuits are mapped to a hard-wire metal links to provide the identical functionality in the latter. Once the programming pattern is finalized with the thin-film module, and the device is tested and verified for performance, the TFT cells can be eliminated by hard-wire connections. Such conversions allow the user a lower cost and more reliable end product. These products offer an enormous advantage in lowering NRE costs and improving TTS in the ASIC design methodology in the industry.

The latch can be used in a generic field programmable gate array (FPGA) or an application specific integrated circuit (ASIC). In both cases the logic content mapped to LUTs is further enhanced by creating larger logic functions including extra inputs and the latch. Thus less Si (hence cheaper) and faster logic computations are achieved by the disclosed latch logic mapping. Although an illustrative embodiment of the present invention, and various modifications thereof, have been described in detail herein with reference to the accompanying drawings, it is to be understood that the invention is not limited to this precise embodiment and the described modifications, and that various changes and further modifications may be effected therein by one skilled in the art without departing from the scope or spirit of the invention as defined in the appended claims.

What is claimed is:

1. A latch, comprising:
   a first programmable logic element (LE);
   a second programmable logic element (LE);
   an output of the first LE adapted to directly couple to a first input of the second LE;
   an output of the second LE coupled to a first input of the first LE;
   a first common input coupled to a second input of the first and second LE; and a second common input coupled to a third input of the first and second LE.

2. The latch of claim 1, wherein the first common input comprises a data input to receive data to be stored in the latch.

3. The latch of claim 1, wherein the second common input comprises one of: an enable input and a clock input that determines a latch state.

4. The latch of claim 3, wherein the latch state comprises one of: a previous data stored state and a current data stored state.

5. The latch of claim 1, wherein when the second common input is at a first logic level, the first LE output corresponds to an opposite logic state of the second LE output, and the second LE output corresponds to an opposite logic state of the first LE output.

6. The latch of claim 1, wherein when the second common input is at a second logic level, the first LE output corresponds to a logic state of the first common input, and the second LE output corresponds to an opposite logic state of the first common input.

7. The latch of claim 1, wherein the first and second programmable logic elements are configured by a configuration circuit.

8. The latch of claim 7, wherein the configuration circuit comprises one or more memory elements from random access memory elements and read only memory elements.

9. The latch of claim 1, wherein a said logic element comprises one or more of look-up-table (LUT), multiplexer (MUX), NAND, NOR, invert, product-term, arithmetic, and processor logic elements.

10. A method for providing a latch, comprising:
   providing a first logic element (LE) having at least three inputs and an output;
   providing a second logic element (LE) having at least three inputs and an output;
   providing a configuration circuit having memory elements to program the first and second logic elements;
   providing a local interconnect to couple the first LE output to the first input of second LE;
   coupling the second LE output to the first input of first LE;
   coupling a data input to the second input of first and second LE; and
   coupling a control input to the third input of first and second LE.

11. The method of claim 10, wherein the data input provides data to store in the latch.

12. The method of claim 10, wherein the control input determines if the latch maintains a previously written data state or stores a new data state determined by the data input.

13. The method of claim 10, wherein when the control input is at a first logic level, the first LE output corresponds to an opposite logic state of the second LE output, and the second LE output corresponds to an opposite logic state of the first LE output.

14. The method of claim 10, wherein when the control input is at a second logic level, the first LE output corresponds to a logic state of the first common input, and the second LE output corresponds to an opposite logic state of the first common input.

15. The method of claim 10, wherein configuration circuit comprises one or more memory elements.

16. The method of claim 10, wherein configuration circuit comprises a memory element from one of: EPROM, EEPROM, Flash, fuses, anti-fuses, metal-links, resistance-modulating, ferro-electric, magnetic, optical, magneto-electric, opto-electric, and fiber memory elements.

17. The method of claim 10, wherein the logic element comprises one or more of: look-up-table (LUT), multiplexer (MUX), NAND, NOR, invert, product-term, arithmetic, and processor logic elements.

18. A programmable logic device adapted to implement a latch, the device comprising:
   a plurality of programmable logic element (LE), each LE having a plurality of inputs and at least one output;
   a configuration circuit to configure the programmable logic elements;
   an output of a first LE adapted to directly couple to a first input of a second LE;
   an output of the second LE coupled to a first input of the first LE;
   a data input coupled to a second input of the first and second LE; and
   a control input coupled to a third input of the first and second LE.

19. The device of claim 18, including one or more of: look-up-table, multiplexer, NOR, NAND, invert, product-term, arithmetic, processor, memory, Intellectual property core, analog and DSP circuit block.

20. The device of claim 18, including one or more of input, output, I/O, power and ground pins to couple the device to one or more integrated circuits.

* * * * *